United States Patent
Anand et al.

(10) Patent No.: US 8,112,697 B2
(45) Date of Patent: Feb. 7, 2012

(54) METHOD AND APPARATUS FOR BUFFERING AN ENCODED SIGNAL FOR A TURBO DECODER

(75) Inventors: Amit Anand, Santa Clara, CA (US); Hariprasad Gangadharan, Santa Clara, CA (US); Prasoon Kumar, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 1051 days.

(21) Appl. No.: 12/004,569

(22) Filed: Dec. 21, 2007

(65) Prior Publication Data

US 2009/0164868 A1 Jun. 25, 2009

(51) Int. Cl.
 *H03M 13/03* (2006.01)
 *H03M 13/00* (2006.01)
 *G06F 11/00* (2006.01)
 *H04B 10/08* (2006.01)

(52) U.S. Cl. ........ 714/790; 714/794; 714/752; 370/241; 398/9; 398/10; 398/17

(58) Field of Classification Search ............... 714/790, 714/794, 752; 370/241; 398/9, 10, 17
See application file for complete search history.

(56) References Cited

U.S. PATENT DOCUMENTS

| | | | | |
|---|---|---|---|---|
| 6,643,332 | B1 * | 11/2003 | Morelos-Zaragoza et al. | 375/265 |
| 6,785,861 | B2 * | 8/2004 | Scalise et al. | 714/786 |
| 7,210,089 | B2 * | 4/2007 | Xu et al. | 714/751 |
| 7,447,984 | B2 * | 11/2008 | Cameron et al. | 714/800 |
| 7,738,487 | B2 * | 6/2010 | El-Maleh et al. | 370/466 |
| 7,751,718 | B2 * | 7/2010 | Sage | 398/141 |
| 2002/0061071 | A1 * | 5/2002 | Cameron et al. | 375/295 |
| 2007/0230632 | A1 * | 10/2007 | Bai et al. | 375/341 |

* cited by examiner

*Primary Examiner* — John J Tabone, Jr.
(74) *Attorney, Agent, or Firm* — Sterne Kessler Goldstein & Fox PLLC

(57) ABSTRACT

A method and apparatus for buffering an encoded signal having a plurality of codewords for a turbo decoder is provided. The method comprises de-interleaving each sub-block of the codeword received at the turbo-decoder; and storing LLRs of the de-interleaved codeword LLRs into an input buffer. Thereafter, each of punctured locations, if any, in the de-interleaved codeword is indicated to a read logic for enabling the latter to fill in each of those locations with a pre-determined LLR value as and when a read request corresponding to one of those locations arrives. This method obviates the need for storing the pre-determined LLRs at the punctured locations into the input buffer and thereby cuts down the input latency of turbo decoder significantly for higher code rates.

20 Claims, 6 Drawing Sheets

METHOD AND APPARATUS FOR BUFFERING AN ENCODED SIGNAL FOR A TURBO DECODER

BACKGROUND

The present invention generally relates to a turbo decoder. More specifically, the present invention relates to a method and apparatus for buffering an encoded signal for a turbo decoder in a communication network.

Advance communication systems, which are prone to interference and channel variations, employ forward error correcting (FEC) codes to minimize bit errors and/or improve energy efficiency. In a typical FEC encoder/decoder system, data is encoded by adding some redundant bits to the data. The redundant bits are then transmitted along with the data over a physical channel. At the receiving end, a FEC decoder tries to correct the bit errors, if any, in the received data by exploiting the redundant bits. If more redundant bits are added to the data, the code becomes more powerful. However, the data communication becomes less efficient due to reduction in the ratio of information bits to the total bits transmitted over the physical channel. Additionally, more number of processing cycles is required on both transmitting and receiving ends of the communication system when more redundant bits are added for encoding the data. Turbo code is one of the most powerful FEC codes known today due to its high coding efficiency at relatively manageable complexity.

In a typical turbo encoder, an encoding module receives specified number of information bits and generates a codeword. The codeword comprises original information bits, called systematic bits, and redundant bits, called parity bits. The codeword is typically organized as one or more data sub-blocks comprising only the systematic bits followed by one or more parity sub-blocks comprising only the parity bits. Initially, each sub-block in the codeword is of same size.

An example of the encoding module can include, but not limited to, a binary or duo-binary circular recursive systematic convolutional encoding module. FIG. 1 is a block diagram of a duo-binary encoding module of a typical turbo codec system. Duo-binary encoding module 100 includes an interleaver 102, an encoding unit 104 and an encoding unit 106. Encoding unit 104 receives a data sub-block A and data sub-block B and generates parity sub-block Y1 and parity sub-block W1. Interleaver 102 changes the sequence of information bits in data sub-block A and data sub-block B and outputs the corresponding interleaved data sub-blocks to encoding unit 106. Encoding unit 106 generates an interleaved parity sub-block Y2 and an interleaved parity sub-block W2. A serializing unit 108 receives all the data sub-blocks and parity sub-blocks and outputs a codeword. Each of these sub-blocks comprises N bits. For 2N information bits, duo-binary encoding module 100 generates 6N bits, therefore its native code rate is ⅓.

FIG. 2 is a block diagram of a typical turbo codec system 200. Turbo codec system 200 includes a turbo encoder 202 and a turbo decoder 204. An encoding module 206 receives information bits and outputs a codeword. The codeword includes one or more data sub-blocks comprising information bits and one or more parity sub-blocks comprising parity bits. A sub-block interleaving module 208 changes the bit sequence of each sub-block of the codeword using an identical permutation formula. Sub-block interleaving module 208 is a second level interleaver in addition to the interleaver provided within encoding module 206. Having multiple levels of interleaving increases the complexity of the code and hence the coding efficiency. However, it increases the storage requirements at the receiving end of the communication system as the decoder cannot start processing the codeword until is completely de-interleaved.

After sub-block interleaving, depending upon the varying channel conditions, a puncturing module 210 punctures the codeword to improve its code rate from the native code rate of encoding module 206. Puncturing is achieved by removing one or more parity bits of one or more parity sub-blocks in the codeword. For example, if channel conditions are favorable, code rate can be increased by removing more parity bits as less number of bit errors are expected to occur and hence even with smaller set of parity bits, decoder can correct the bit errors. On the contrary, if channel conditions are bad, decoder may not be able to correct all the bit errors even with complete set of parity bits and hence either less number of parity bits or no parity bits should be discarded. For example, for fixed wireless applications with good channel conditions, the code rate can be made as high as ⅚.

Thereafter, the codeword is transmitted to turbo decoder 204 of a receiver through a physical channel 212. Turbo decoder 204 includes a sub-block de-interleaving module 216, an input buffer 218, a read logic 220 and a decoding module 222. At turbo decoder 204, the information bits and the parity bits are represented as Log-Likelihood Ratios (LLRs). LLR is a soft estimate of the symbol received at turbo decoder 204. The soft estimate indicates the probability of the received symbol being close to 1 or 0. Therefore, the codeword received at turbo decoder 204 is a sequence of data LLRs and parity LLRs and not the sequence of information bits and parity bits. The reason for representing the information bits and parity bits as LLRs is that a Soft-In-Soft-Out (SISO) processor of decoding module 222 is designed to work on soft-data only. The width of the LLR can vary depending upon the channel conditions. However, for most of the applications 8-bit width is more than sufficient for representing the LLR.

In order to be decoded by decoding module 222, the sequence and number of LLRs of the received codeword must be identical to those of the codeword generated by turbo encoder 202. Therefore the effects of puncturing and sub-block interleaving have to be annulled before passing the received codeword to the decoding module 222. De-puncturing module 214 inserts a pre-defined value in place of the parity bits removed from the codeword during puncturing to restore the native code rate of encoding module 206. For example, the native code rate of encoding module 206 is ⅓ and the code rate of the codeword after puncturing is ½. This implies that two parity sub-blocks of the codeword were completely removed during puncturing. In this case, to restore the native code rate, i.e., ⅓, de-puncturing module 214 inserts a predefined value in place of each parity bit which was removed by completely puncturing the two parity sub-blocks.

The SISO processor of decoding module 222 cannot start processing until the de-punctured codeword is sub-block de-interleaved and stored in input buffer 218. Therefore, a sub-block de-interleaving module 216 de-interleaves each sub-block of the codeword to re-establish the original sequence of bits within each sub-block. Thereafter, each sub-block of the codeword received at turbo decoder 204 is stored in input buffer 218. A considerable number of cycles are spent in storing the codeword if the codeword size is large. In IEEE802.16e, the maximum permissible size of the codeword is 14400 bits. This adds to the input latency of decoding process and adversely affects the overall processing time of turbo decoder 204. Several implementation strategies have been proposed to bring down the processing cycles of SISO processor but very little or no effort has been invested to bring down the input latency.

Accordingly, what is a needed is an improved turbo decoder which has low input latency for code rates which are higher than the native code rate of the encoding module.

SUMMARY

An embodiment provides a method and apparatus for buffering an encoded signal for a turbo decoder.

Another embodiment provides a method and apparatus for mimimizing the latency in buffering the encoded signal.

Embodiments listed below include a method and apparatus for buffering an encoded signal having a plurality of codewords for a turbo decoder. The method includes de-interleaving each sub-block of each codeword received at the turbo-decoder. A sub-block is one of a data sub-block and a parity sub-block, and each sub-block includes plurality of LLRs. The method further includes storing each codeword received at the decoder in an input buffer. Thereafter, location of each punctured LLR and parity LLR in each parity sub-block of each codeword is indicated to a read logic. The punctured LLR corresponds to a parity bit removed by puncturing at a turbo encoder. The valid LLR corresponds to a parity bit retained during puncturing at the turbo encoder.

BRIEF DESCRIPTION OF DRAWINGS

A more complete appreciation of the present invention is provided by reference to the following detailed description when considered in conjunction with the accompanying drawings in which reference symbols indicate the same or similar components, wherein.

DETAILED DESCRIPTION OF THE DRAWINGS

Various embodiments described herein provide methods and apparatuses for buffering an encoded signal having a plurality of codewords for a turbo decoder in a communication network. A turbo decoder receives an encoded signal having a plurality of codewords. The method comprises de-interleaving each sub-block of the received codeword. The sub-block is one of a data sub-block and a parity sub-block. The sub-block includes one or more Log Likelihood Ratios (LLRs). The LLRs of the de-interleaved codeword are then stored in an input buffer. Thereafter, location of each punctured LLR and each valid LLR in each parity sub-block of the received codeword is indicated to a read logic. The punctured LLR corresponds to a parity bit removed during puncturing at turbo encoder. The valid LLR corresponds to a parity bit retained during puncturing at turbo encoder. Thereafter, the read logic fills each of those locations with a pre-determined LLR value as and when a read request corresponding to those locations arrives.

Figure 3:
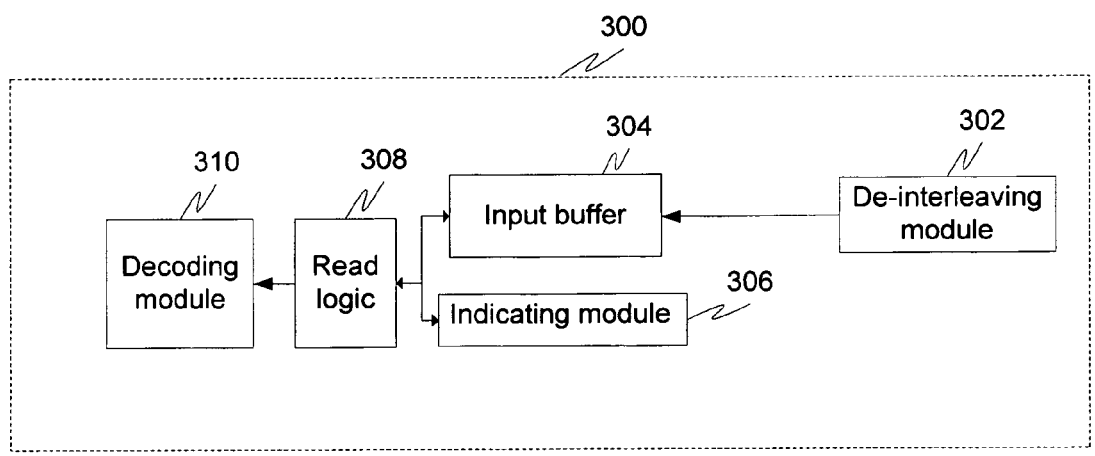
FIG. 3 is a block diagram showing a turbo decoder in a communication network, in accordance with an embodiment.

FIG. 3 is a block diagram showing a turbo decoder 300 in communication network, in accordance with an embodiment. Examples of communication network may include, but are not limited to, Worldwide Interoperability for Microwave Access (WiMAX), Wideband Code Division Multiple Access (WCDMA), Code Division Multiple Access (CDMA) 2000, Universal Mobile Telecommunications System (UMTS), Global System for Mobile communications (GSM), and other networks compliant with IEEE 802.16. Turbo decoder 300 includes a de-interleaving module 302, an input buffer 304, and an indicating module 306. Turbo decoder 300 may be a Convolutional Turbo Code (CTC) decoder. An encoded signal, which includes a plurality of codewords, is transmitted from turbo encoder 202 and is received by turbo decoder 300. Thereafter, de-interleaving module 302 de-interleaves each sub-block of each codeword received at turbo decoder 300. A sub-block is one of a data sub-block and a parity sub-block. Each sub-block in a codeword received at turbo decoder 300 includes a plurality of Log Likelihood Ratios (LLRs). De-interleaving is performed to re-arrange LLRs in each sub-block of a codeword, such that, LLRs in each sub-block of the codeword received are aligned in accordance with the original sequence of the bits in each sub-block in the codeword generated by turbo encoder 202.

Thereafter, each codeword received at turbo decoder 300 is stored in input buffer 304. In input buffer 304, LLRs of each sub-block are stored in a separate memory bank to enable parallel read out of data LLRs and parity LLRs by a read logic 308. LLRs are written serially, that is, one at a time in input buffer 304. Therefore, if a received codeword includes 'K' LLRs, then 'K' cycles are spent in storing the complete codeword.

Indicating module 306 indicates the position of each punctured LLR and each valid LLR in one or more parity sub-blocks of each codeword received at turbo decoder 300 to read logic 308. Indicating module 306 may create an array corresponding to one or more punctured parity sub-blocks parallel to the storing of one or more data sub-blocks of the codeword in input buffer 304. Indicating module 306 stores information about position of punctured LLRs and valid LLRs of the codeword in the array. The stored information is then used by read logic 308 to identify whether the current read access corresponds to a valid parity LLR or a punctured parity LLR. This is further explained in detail in conjunction with FIG. 4. A decoding module 310 in turbo decoder 300 then uses the information read by read logic 308 to decode the encoded signal.

Figure 4:
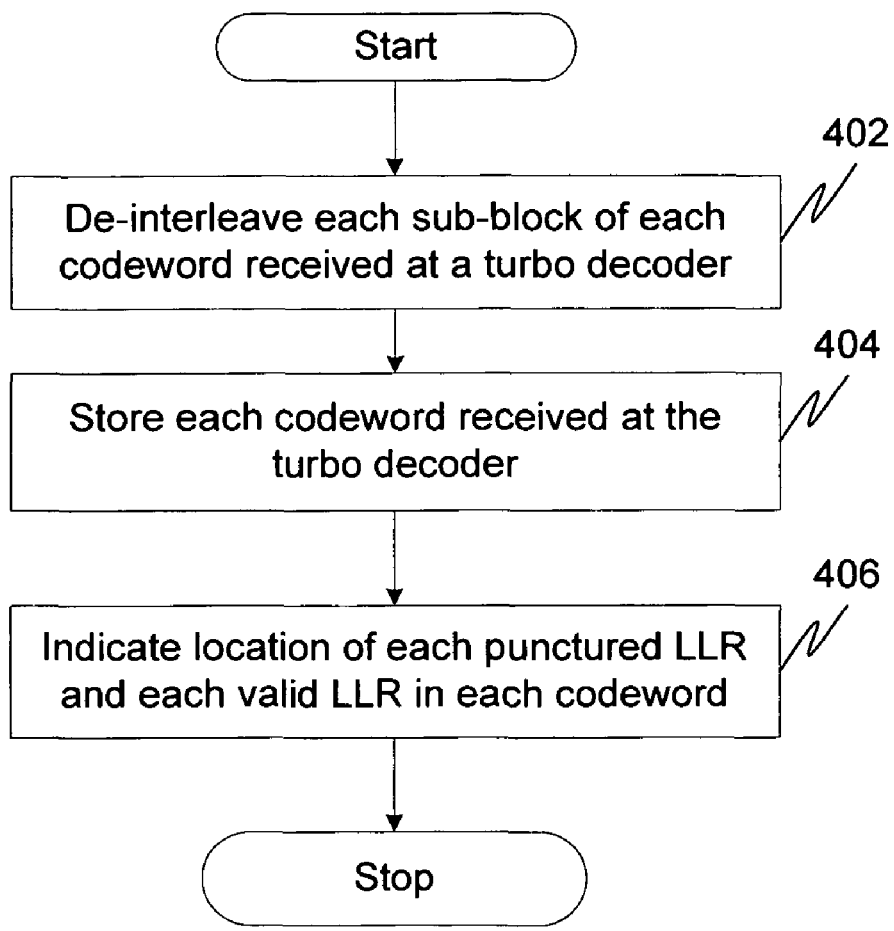
FIG. 4 is a flowchart for buffering an encoded signal having a plurality of codewords for a turbo decoder in a communication network, in accordance with an embodiment.

FIG. 4 is a flowchart for buffering an encoded signal having a plurality of codewords for turbo decoder 300 in communication network, in accordance with an embodiment. Each codeword in the encoded signal may have a different code rate. For example, an encoded signal has three codewords. A first codeword may have a code rate of ½, a second codeword may have a code rate of ⅓, and a third codeword may have a code rate of ⅚. The code rate of each codeword may be changed if the channel conditions are varying. From the code rate of the received codeword, the number of parity bits punctured by puncturing module 210 can be determined.

At 402, de-interleaving module 302 de-interleaves each sub-block of each codeword received at turbo decoder 300. A sub-block can be one of a data sub-block and a parity sub-block. Each sub-block includes a plurality of LLRs. De-interleaving is performed to re-arrange LLRs in each sub-block of a codeword, such that, LLRs in each sub-block of the codeword received are aligned in accordance with the original sequence of the bits in each sub-block in the codeword generated by turbo encoder 202. A data sub-block includes a plurality of data LLRs. A parity sub-block includes a plurality of valid LLRs and/or one or more punctured LLRs. For a parity sub-block, a valid LLR corresponds to a parity bit retained during puncturing. A punctured LLR corresponds to a parity bit removed during puncturing at turbo encoder 202.

Puncturing is performed at turbo encoder 202 only on one or more parity sub-blocks and is done to improve the bandwidth efficiency of the physical channel 212. Puncturing of the parity bits may be performed in a random pattern. In a random pattern puncturing, parity bits are removed from one or more parity sub-blocks in random manner. For example, a codeword includes two data sub-blocks and four parity sub-blocks. The parity bits in a first parity sub-block may be represented as: $\{Y1_1, Y1_2, \ldots, Y1_N\}$; and the parity bits in a second parity sub-block may be represented as: $\{Y2_1, Y2_2, \ldots, Y2_N\}$. When the codeword is subjected to random puncturing, parity bits $Y1_1, Y1_4, Y1_8,$ and $Y1_N$ are removed from the first parity sub-block. However, from the second parity sub-block parity bits $Y2_8, Y2_5,$ and $Y2_3$ are removed. Therefore, unequal number of bits is removed from the two parity sub-blocks, and also the position of the parity bits removed from the two parity sub-blocks are not same. Alternatively, puncturing may be performed in accordance with IEEE 802.16 standard. To be complaint with IEEE 802.16 standard, equal number of trailing parity bits is removed from one or more parity sub-blocks of a codeword during puncturing. In an embodiment, equal number of leading parity bits may be removed from one or more parity sub-blocks during puncturing.

After de-interleaving, at 404, each codeword is stored in input buffer 304. Input buffer 304 has a separate memory bank for each sub-block of the codeword. Since the codeword is written into the input buffer 304 without de-puncturing, for each sub-block in the codeword, only the valid LLRs of a sub-block are stored in input buffer 304. As a result, the cycles spent in storing the entire codeword is reduced. The reduction in number of cycles is based on the number of punctured LLRs in the received codeword. This reduces the input latency of turbo decoder 300 which is explained in greater detail in conjunction with FIG. 5.

At 406, Indicating module 306 indicates position of each punctured LLR and each valid LLR in one or more parity sub-blocks of each codeword received at turbo decoder 300 to read logic 308. For this, indicating module 306 creates an array. Information regarding the position of punctured LLRs and valid LLRs of the codeword are written in the array parallel to the storing of the one or more data sub-blocks of the codeword at 404. Information written in the array is then accessed by read logic 308 parallel to the reading of LLRs from input buffer 304.

Figure 5:
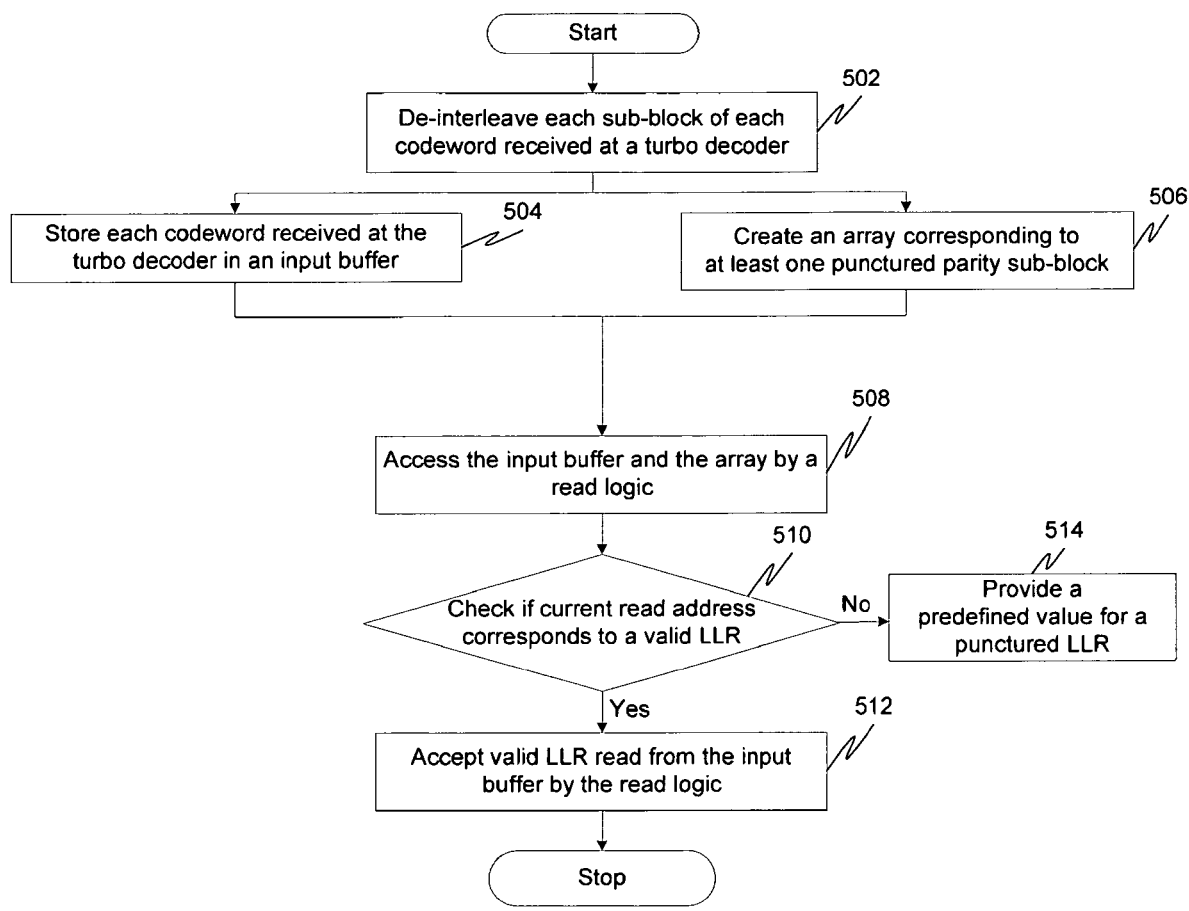
FIG. 5 is a flowchart for buffering an encoded signal having a plurality of codewords for a turbo decoder in a communication network, in accordance with another embodiment.

FIG. 5 is a flowchart for buffering an encoded signal having a plurality of codewords for turbo decoder 300 in communication network, in accordance with an embodiment. At 502, de-interleaving module 302 de-interleaves each sub-block of each codeword received at turbo decoder 300. Thereafter, each codeword is stored in input buffer 304 at 504. This has been explained in conjunction with FIG. 4 given above. At 506, indicating module 306 creates an array corresponding to one or more punctured parity sub-blocks of a codeword received at turbo decoder 300. An array is created simultaneous to storing one or more data sub-blocks of the codeword in input buffer 304. The size of the array is related to the size of the corresponding punctured parity sub-block. The size of the array can be, at its maximum, equal to the size of the corresponding punctured parity sub-block.

A punctured parity sub-block includes one or more punctured LLRs. An array created for a punctured parity sub-block is used for indicating the location of each punctured LLR and each valid LLR in the corresponding punctured parity sub-block of the codeword. Referring back to FIG. 4, if the puncturing of parity bits is performed at random, indicating module 306 creates an array corresponding to each punctured parity sub-block of the codeword received at turbo decoder 300. As an example for this scenario, a codeword, which has a native code rate of ½, includes a data sub-block A, a data sub-block, B, a parity sub-block Y1, and a parity sub-block Y2. At puncturing module 210, puncturing of the parity sub-block Y1 and the parity sub-block Y2 is carried out in a random manner to vary the native code rate. As a result of this, parity bits are randomly removed from the parity sub-block Y1 and the parity sub-block Y2. Due to random puncturing, the position and the number of the parity bits removed from the parity sub-block Y1 and the parity sub-block Y2 do not correspond with each other, therefore, an array is created for the parity sub-block Y1 and another array is created for the parity sub-block Y2.

Alternatively, if the puncturing is performed in compliance with IEEE 802.16, a common array is created for a plurality parity sub-blocks. In an embodiment, if each sub-block of the codeword has a size of N bits, then the size of the common array is N×1. In another embodiment, the common array may be a one-bit array created for the plurality of punctured parity sub-blocks, if the plurality of punctured parity sub-blocks is punctured completely.

The following table depicts the composition of received code words vis-à-vis different code rates supported in IEEE 802.16.

| Coding rates | Codeword | | | | | |
|---|---|---|---|---|---|---|
| ⅓ | A | B | Y1 | Y2 | W1 | W2 |
| ½ | A | B | Y1 | Y2 | | |
| ⅔ | A | B | ½Y1 | ½Y2 | | |
| ¾ | A | B | ⅓Y1 | ⅓Y2 | | |
| ⅚ | A | B | ⅕Y1 | ⅕Y2 | | |

For the trivial case, where the code rate of the received codeword is equal to the native code rate ⅓, no puncturing is done. However, for other code rates, each of the parity sub-block W1 and parity sub-block W2 is punctured in its entirety. Furthermore, for all code rates other than the native code rate, each of the parity sub-block Y1 and parity sub-block Y2 is punctured identically, that is, equal number of parity bits is removed from identical positions.

Therefore, only one bit of information is sufficient to indicate to read logic 308 whether each of the parity sub-block W1 and the parity sub-block W2 is present or absent in its entirety. Additionally, only one N×1 flag array is sufficient to store the information about location of each valid LLR and each punctured LLR of both parity sub-block Y1 and parity sub-block Y2. The size of the N×1 array can be fixed to the size of the largest sub-block length supported in the IEEE 802.16 standard. In an embodiment, the size of the array can be implemented with the help of N×1 single port flag RAM to minimize the hardware overheads. Since the read operation can start only after the codeword is de-interleaved and completely stored in input buffer 304, sufficient number of cycles is available to update the N×1 flag RAM.

To distinguish the valid parity LLRs from the punctured parity LLRs in a parity sub-block of the codeword, different flags can be stored in the array corresponding to that parity sub-block. In an embodiment, the array can be implemented as a bitmap which uses one-bit binary coding for indicating the position of valid parity LLRs and punctured parity LLRs. For example, in the bitmap, bit value '1' can be assigned to indicate a valid LLRs and bit value '0' can be assigned to indicate a punctured LLRs in a given parity sub-block in the corresponding address of input buffer 304. This is explained in detail in conjunction with FIG. 6 given below.

After creating an array for one or more punctured parity sub-blocks in a codeword, read logic 308 accesses input buffer 304 and the array corresponding to a punctured parity sub-block in the codeword at 508. Read logic 308 accesses the array simultaneous to reading each sub-block of the codeword from input buffer 304. This is further explained in detail in conjunction with FIG. 6.

Thereafter, at 510, a check is performed to determine if current read address of read logic 308 corresponds to a valid LLR. If the current read address corresponds to a valid LLR, read logic 308 accepts the valid LLR read from input buffer 304 at 512. However, when the current read address of read logic 308 does not correspond to a valid LLR, i.e., the current read address corresponds to a punctured LLR, de-puncturing is performed on the punctured LLR at 514. De-puncturing is performed by outputting a pre-defined value to read logic 308 in response to identifying that the current read address is a punctured LLR. The predefined value, for example, may be a zero LLR.

Figure 1:
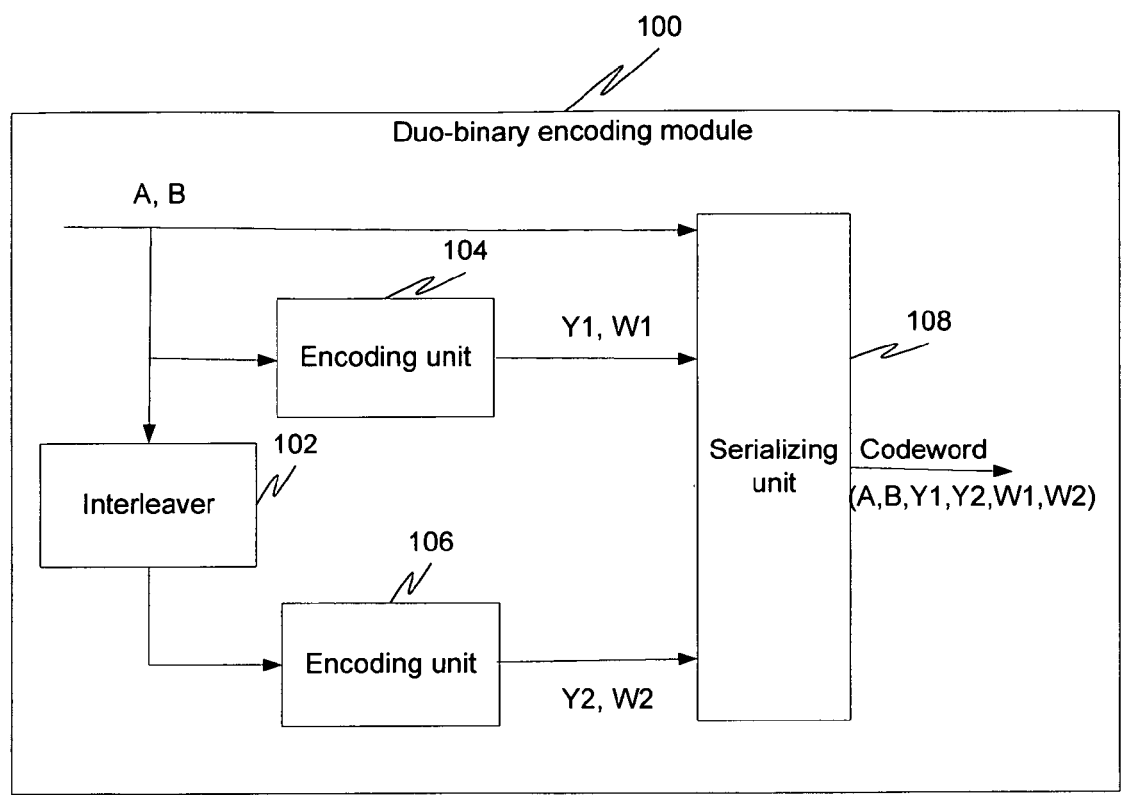
FIG. 1 is a block diagram showing a duo-binary encoding module of a typical turbo codec system.
Figure 2:
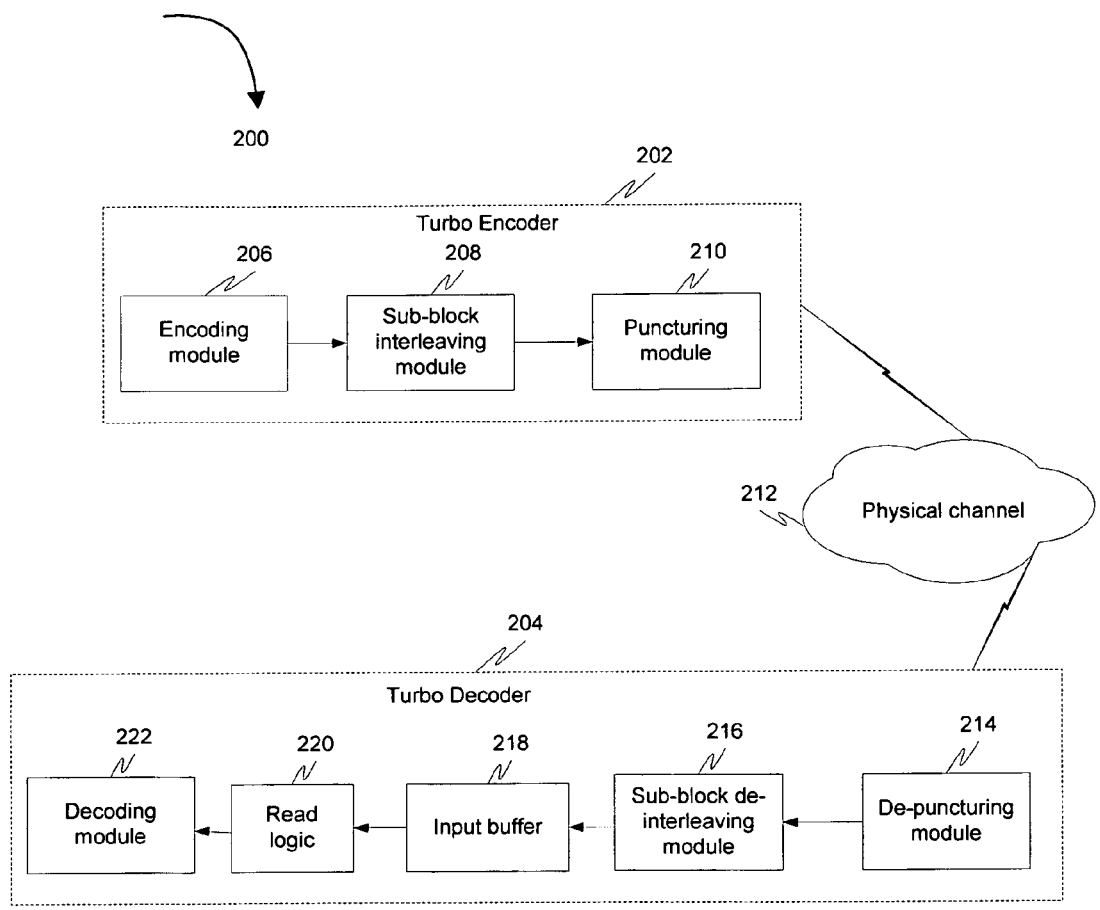
FIG. 2 is a block diagram showing a typical turbo codec system.
Figure 6:
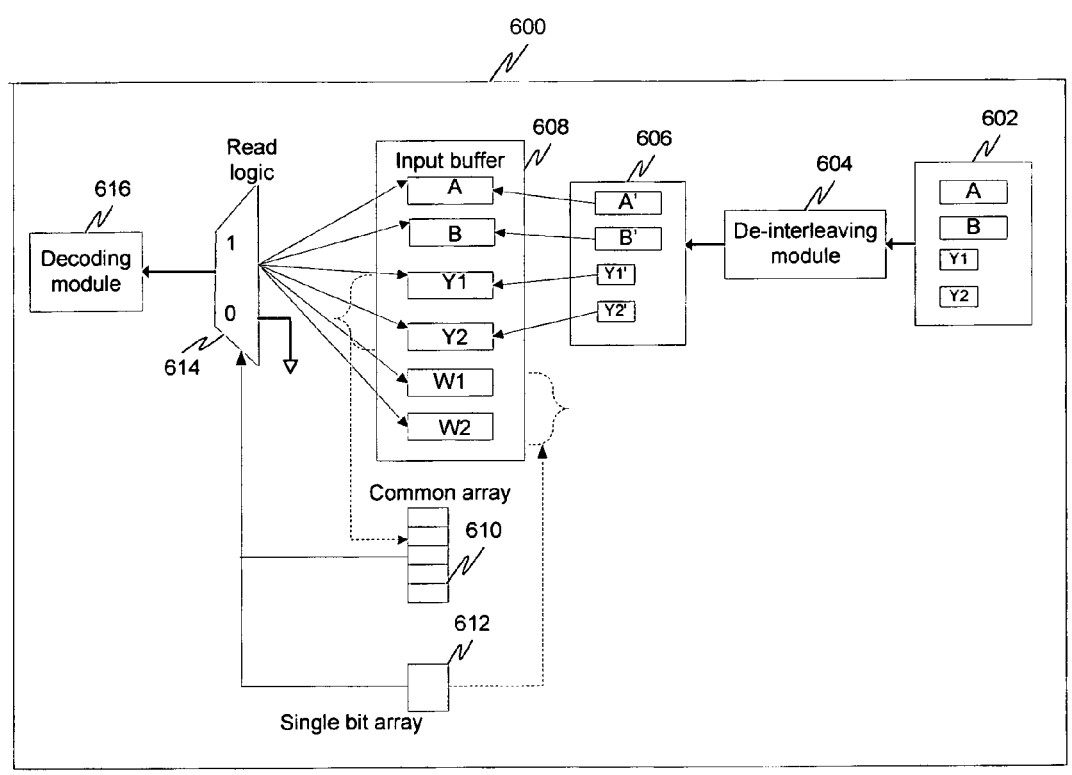
FIG. 6 is a block diagram illustrating the buffering of an encoded signal complaint with IEEE 802.16 standard, in accordance with an exemplary embodiment.

FIG. 6 is a block diagram illustrating the buffering of an encoded signal complaint with IEEE 802.16 standard, in a turbo decoder 600 in accordance with an exemplary embodiment. IEEE 802.16 standard uses duo-binary circular recursive systematic convolutional encoder. Referring back to FIG. 2, encoding module 206 outputs codeword, which includes data sub-block A and data sub-block B, followed by a parity sub-block Y1, a parity sub-block Y2, a parity sub-block W1 and a parity sub-block W2. All the sub-blocks are initially of same length N. The native codeword, therefore, has a code rate ⅓ and is sent to a sub-block interleaving module 208 from encoding module 206. Due to interleaving of the codeword, the sequence of information bits and parity bits is different from that of the codeword before interleaving. Before transmission of the codeword to a receiver, puncturing module 210 removes equal number of trailing parity bits from each of the parity sub-block Y1 and the parity sub-block Y2, such that half of the parity sub-block Y1 and half of the parity sub-block Y2 are removed. In addition, puncturing module 210 also completely removes parity sub-block W1 and parity sub-block W2. As a result, the code rate is changed from ⅓ to ⅔. Thereafter, the codeword is transmitted through physical channel 212 to the receiver.

The codeword received by turbo decoder 600 of receiver is a punctured and sub-block interleaved codeword 602. A de-interleaving module 604 in turbo decoder 600 de-interleaves each sub-block of the punctured and sub-block interleaved codeword 602 in the order they are received to generate a de-interleaved codeword 606. The sequence of the data LLRs and parity LLRs in de-interleaved codeword 606 is same as that of the codeword generated by encoding module 206. Thereafter, de-interleaved codeword 606 is stored in an input buffer 608. Input buffer 608 includes six memory banks, each storing one of the six sub-blocks in the de-interleaved codeword 606. The received codeword will have all the sub-blocks intact if its code rate is equal to the native code rate ⅓, else it will have one or more incomplete parity sub-blocks along with data sub-blocks. Input buffer 608 therefore is designed to accommodate the largest codeword that can be received by the turbo decoder 600.

Simultaneous to storing the data sub-block A and the data sub-block B in input buffer 608, a common array 610 is created for parity sub-block Y1 and parity sub-block Y2. Similarly, a single bit array 612 is created for parity sub-block W1 and parity sub-block W2. The length of common array 610 is equal to N×1, where N is the sub-block length. To indicate the position of each valid LLR and each punctured LLR in each of the parity sub-blocks Y1 and the parity sub-block Y2 to a read logic 614, different flags are set in common array 610. Alternatively, bit mapping is used to indicate the position of valid LLR and punctured LLR. The bit value '1' indicates a valid LLR t and '0' indicates a punctured LLR in a parity sub-block. Similarly, the bit value '0' in single bit array 612 may indicate the complete removal of parity sub-block W1 and parity sub-block W2 to read logic 614.

When read logic 614 reads each sub-block of de-interleaved codeword 606 from input buffer 608, read logic 614 also accesses common array 610 and single bit array 612 for decoding de-interleaved codeword 606. Read logic 614 accesses common array 610 and single bit array 612 to check if its current read address corresponds to a valid LLR or a punctured LLR. If the current read address corresponds to a valid LLR, read logic 614 accepts the valid LLR read from input buffer 608. However, if the current read address corresponds to a punctured LLR, then de-puncturing is performed on the punctured LLR. To perform de-puncturing, a pre-defined value is provided to read logic 614 for the punctured LLR in response to identifying that the current read address is a punctured LLR. As a result of this procedure, the step of performing explicit de-puncturing is bypassed, thereby saving time and computational resources. A decoding module 616 in turbo decoder 600 then uses the information read by read logic 614 to decode the encoded signal.

Various embodiments provide methods and apparatuses for buffering an encoded signal having a plurality of code words in a turbo decoder in a communication network. In this method, as de-puncturing is not performed prior to de-interleaving, need for storing the de-punctured LLRs is avoided. Therefore, the time required for storing the codeword in the input buffer is reduced considerably to 2N/C, where N is the size of a sub-block and C is the code rate of the received codeword. In a typical turbo decoder, 6N cycles are needed to store the codeword regardless of the code rate of the received codeword since de-puncturing precedes storing of the received codeword. Thus the current approach saves (6N−2N/C) i.e. 2N(3−1/C) cycles while storing the codeword in input buffer.

Percentage improvement over the prior art turbo decoder is given by (1−1/3C)*100 and is tabulated for various supported code rates below:

| Coding rate (C) | Percentage of reduction in input buffer storage time |
| --- | --- |
| ⅓ | 0 |
| ½ | 33 |
| ⅔ | 50 |
| ¾ | 55 |
| ⅚ | 60 |

It is evident from the table that higher the code rate, higher is the percentage reduction in input buffer fill time or the input latency of the turbo decoder. In the exemplary embodiment compliant to IEEE 802.16 standard, reduction in input latency of the turbo decoder is achieved with relatively low overhead, for example using an N×1 single port flag RAM.

What is claimed is:

1. A method for buffering an encoded signal received by a turbo decoder in a communication network, the encoded signal having been generated by a turbo encoder after a puncturing process and including a codeword having sub-blocks, the method comprising:

de-interleaving the sub-blocks of the codeword received at the turbo decoder, each sub-block being either a data sub-block or a parity sub-block and including a plurality of Log Likelihood Ratios (LLRs), each of the plurality of LLRs being either a punctured LLR or a valid LLR;

storing the codeword received by the turbo decoder in an input buffer; and indicating to a read logic, for at least one punctured parity sub-block of the codeword, a position of each punctured LLR and each valid LLR, wherein each punctured LLR corresponds to a party bit removed during the puncturing performed by the turbo encoder, and each valid LLR corresponds to a parity bit retained during the puncturing performed by the turbo encoder.

2. The method of claim 1, wherein the indicating includes creating an array corresponding to one punctured parity sub-block of the at least one punctured parity sub-block, the one punctured parity sub-block includes a punctured LLR, and the size of the array is associated with the size of the one punctured parity sub-block.

3. The method of claim 2, wherein flags are set in the array for indicating the position of each valid LLR and each punctured LLR in the one parity sub-block of the at least one punctured parity sub-block.

4. The method of claim 2, wherein the array is created simultaneous with storing a data sub-block of the codeword in the input buffer.

5. The method of claim 4, wherein the read logic accesses the array corresponding to the one punctured parity sub-block to check if a current read address corresponds to one of a valid LLR or a punctured LLR.

6. The method of claim 5, wherein the read logic accesses the array corresponding to the one punctured parity sub-block simultaneous with reading a sub-block from the input buffer.

7. The method of claim 6, wherein, if the current read address corresponds to a valid LLR, the read logic accepts the valid LLR read from the input buffer.

8. The method of claim 6, further comprising, if the current read address corresponds to a punctured LLR, performing de-puncturing for the current read address.

9. The method of claim 8, wherein the de-puncturing includes outputting a pre-defined value to the read logic for the punctured LLR.

10. The method of claim 2, wherein, if turbo encoder performed the puncturing in a random pattern, the array is created for each punctured parity sub-block of the at least one punctured parity sub-block.

11. The method of claim 10, wherein, if the turbo encoder performed the puncturing in compliance with IEEE 802.16, a common array is created for a plurality of punctured parity sub-blocks of the at least one punctured parity sub-block.

12. The method of claim 11, wherein, if the plurality of punctured parity sub-blocks are completely punctured, a one-bit array is created for the plurality of punctured parity sub-blocks.

13. A turbo decoder in a communication network that receives an encoded signal generated by a turbo encoder after a puncturing process, the encoded signal including a codeword having sub-blocks, the turbo decoder comprising:

a read logic;

a de-interleaving module configured to de-interleave the sub-blocks of the codeword, each sub-block being either a data sub-block or a parity sub-block and including a plurality of Log Likelihood Ratios (LLRs), each of the plurality of LLRs being either a punctured LLR or a valid LLR;

an input buffer configured to store the codeword; and an indicating module configured to indicate to the read logic, for at least one punctured parity sub-block of the codeword, a position of each punctured LLR and each valid LLR, wherein each punctured LLR corresponds to a parity bit removed during the puncturing performed by the turbo encoder, and each valid LLR corresponds to a parity bit retained during the puncturing performed by the turbo encoder.

14. The turbo decoder of claim 13, wherein the indicating module is configured to create an array corresponding to one punctured parity sub-block of the at least one punctured parity sub-block, the one punctured parity sub-block includes a punctured LLR, and the size of the array is associated with the size of the one punctured parity sub-block.

15. The turbo decoder of claim 14, wherein the indicating module is configured to set flags in the array for indicating the position of each valid LLR and each punctured LLR in the one parity sub-block of the at least one punctured parity sub-block.

16. The turbo decoder of claim 14, wherein the read logic is configured to access the array corresponding to the one punctured parity sub-block to check if a current read address corresponds to one of a valid LLR or a punctured LLR.

17. The turbo decoder of claim 16, wherein the read logic is configured to access the array corresponding to the one punctured parity sub-block simultaneous with reading a sub-block from the input buffer.

18. The turbo decoder of claim 16, wherein, if the current read address corresponds to a valid LLR, the read logic is configured to accept the valid LLR read from the input buffer.

19. The turbo decoder of claim 16, further comprising a de-puncturing module configured to perform de-puncturing of the current read address if the current read address corresponds to a punctured LLR.

20. The turbo decoder of claim 19, wherein the de-puncturing includes outputting a pre-defined value to the read logic for the punctured LLR.

* * * * *